(12) United States Patent
Dutta

(10) Patent No.: US 7,834,468 B2
(45) Date of Patent: Nov. 16, 2010

(54) PASSIVATED NANOPARTICLES, METHOD OF FABRICATION THEREOF, AND DEVICES INCORPORATING NANOPARTICLES

(75) Inventor: Partha Dutta, Clifton Park, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 328 days.

(21) Appl. No.: 11/819,381

(22) Filed: Jun. 27, 2007

(65) Prior Publication Data
US 2007/0248826 A1    Oct. 25, 2007

Related U.S. Application Data

(62) Division of application No. 11/124,244, filed on May 9, 2005, now Pat. No. 7,253,119, which is a division of application No. 10/233,587, filed on Sep. 4, 2002, now Pat. No. 6,906,339.

(60) Provisional application No. 60/316,979, filed on Sep. 5, 2001.

(51) Int. Cl.
H01L 23/29 (2006.01)
(52) U.S. Cl. .............. 257/788; 257/E33.038; 257/40; 977/813; 977/835
(58) Field of Classification Search .......... None
See application file for complete search history.

(56) References Cited

U.S. PATENT DOCUMENTS

| | | |
|---|---|---|
| 4,336,242 A | 6/1982 | Schmidberger et al. |
| 4,484,992 A | 11/1984 | Buehler et al. |
| 5,141,904 A | 8/1992 | Kubicek et al. |
| 5,262,357 A | 11/1993 | Alivisatos et al. |
| 5,411,654 A | 5/1995 | Ahern et al. |
| 5,434,878 A | 7/1995 | Lawandy |
| 5,449,645 A | 9/1995 | Borelli et al. |
| 5,474,591 A | 12/1995 | Wells et al. |
| 5,505,928 A | 4/1996 | Alivisatos et al. |
| 5,525,377 A | 6/1996 | Gallagher et al. |

(Continued)

FOREIGN PATENT DOCUMENTS

EP    0 947 245 B1    4/2004

(Continued)

OTHER PUBLICATIONS

Chemical Abstracts, May 17, 1993, 118(20), one page, XP000431159, Abstract of Denisov et al., SU Patent 1,723,037, Mar. 30, 1992.

(Continued)

Primary Examiner—Jarrett J Stark
(74) Attorney, Agent, or Firm—Foley & Lardner LLP

(57) ABSTRACT

A plurality of semiconductor nanoparticles having an elementally passivated surface are provided. These nanoparticles are capable of being suspended in water without substantial agglomeration and substantial precipitation on container surfaces for at least 30 days. The method of making the semiconductor nanoparticles includes reacting at least a first reactant and a second reactant in a solution to form the semiconductor nanoparticles in the solution. A first reactant provides a passivating element which binds to dangling bonds on a surface of the nanoparticles to passivate the surface of the nanoparticles. The nanoparticle size can be tuned by etching the nanoparticles located in the solution to a desired size.

15 Claims, 6 Drawing Sheets

U.S. PATENT DOCUMENTS

| | | | |
|---|---|---|---|
| 5,537,000 | A | 7/1996 | Alivisatos et al. |
| 5,576,248 | A | 11/1996 | Goldstein |
| 5,614,435 | A | 3/1997 | Petroff et al. |
| 5,690,807 | A | 11/1997 | Clark, Jr. et al. |
| 5,704,556 | A | 1/1998 | McLaughlin |
| 5,705,321 | A | 1/1998 | Brueck et al. |
| 5,751,018 | A | 5/1998 | Alivisatos et al. |
| 5,906,670 | A | 5/1999 | Dobson et al. |
| 5,985,173 | A | 11/1999 | Gray et al. |
| 5,990,479 | A | 11/1999 | Weiss et al. |
| 6,022,500 | A | 2/2000 | John et al. |
| 6,057,556 | A | 5/2000 | Gubin et al. |
| 6,057,561 | A | 5/2000 | Kawasaki et al. |
| 6,090,666 | A | 7/2000 | Ueda et al. |
| 6,106,609 | A | 8/2000 | Yang et al. |
| 6,114,038 | A | 9/2000 | Castro et al. |
| 6,126,740 | A | 10/2000 | Schulz et al. |
| 6,136,156 | A | 10/2000 | El-Shall et al. |
| 6,197,349 | B1 | 3/2001 | Westesen et al. |
| 6,207,229 | B1 | 3/2001 | Bawendi et al. |
| 6,207,392 | B1 | 3/2001 | Weiss et al. |
| 6,225,198 | B1 | 5/2001 | Alivisatos et al. |
| 6,235,540 | B1 | 5/2001 | Silman et al. |
| 6,239,355 | B1 | 5/2001 | Salfsky |
| 6,239,449 | B1 | 5/2001 | Fafard et al. |
| 6,251,303 | B1 | 6/2001 | Bawendi et al. |
| 6,268,014 | B1 | 7/2001 | Eberspacher et al. |
| 6,294,401 | B1 | 9/2001 | Jacobson et al. |
| 6,329,062 | B1 | 12/2001 | Gaynor |
| 6,361,660 | B1 | 3/2002 | Goldstein |
| 6,372,644 | B1 | 4/2002 | Foster et al. |
| 6,395,053 | B1 | 5/2002 | Fau et al. |
| 6,410,934 | B1 | 6/2002 | Nayfeh et al. |
| 6,410,935 | B1 | 6/2002 | Rajh et al. |
| 6,444,143 | B2 | 9/2002 | Bawendi et al. |
| 6,514,767 | B1 | 2/2003 | Natan |
| 6,544,732 | B1 | 4/2003 | Chee et al. |
| 6,548,171 | B1 | 4/2003 | Barbera-Guillem et al. |
| 6,649,138 | B2 | 11/2003 | Adams et al. |
| 6,815,064 | B2 | 11/2004 | Treadway et al. |
| 6,946,197 | B2 | 9/2005 | Yadav et al. |
| 2002/0098653 | A1 | 7/2002 | Flagan et al. |
| 2002/0151602 | A1 | 10/2002 | Vance et al. |
| 2002/0164891 | A1 | 11/2002 | Gates et al. |
| 2003/0047816 | A1 | 3/2003 | Dutta |
| 2003/0170162 | A1 | 9/2003 | Nayfeh et al. |
| 2003/0170383 | A1 | 9/2003 | Eastham |
| 2003/0190475 | A1 | 10/2003 | Carpenter et al. |
| 2004/0023519 | A1 | 2/2004 | Clark et al. |
| 2005/0201963 | A1 | 9/2005 | Dutta |

FOREIGN PATENT DOCUMENTS

| | | |
|---|---|---|
| JP | 56-149323 A | 11/1981 |
| WO | WO 01/38222 A1 | 5/2001 |
| WO | WO 2005/013337 A2 | 2/2005 |

OTHER PUBLICATIONS

Bigham et al., "Thermochemical Passivation of DNA-Stabilized Q-Cadmium Sulfide Nanoparticles," *J. Cluster Science*, 2000, 11(2):359-372.

Gorer et al., "Size-Selective and Epitaxial Electrochemical/Chemical Synthesis of Sulfur-Passivated Cadmium Sulfide Nanocrystals on Graphite," J. Am. Chem. Soc., 1998, 120:9584-9593.

Database Compendex (Online): Duluo et al., "Preparation and quantum confinement effects of amorphous Si3N4 nanoparticles," Engineering Information, Inc., XP002400592, one page.

The Royal Society & The Royal Academy of Engineering, "Nanomanufacturing and the industrial application of nanotechnologies," Nanoscience and nanotechnologies, Jul. 2004, pp. 25-34.

Peng, et al,. "Formation of High-Quality CdTe, CdSe, and CdS Nanocrystals Using Cd O as Precursor," *J. Am. Chem. Soc.*, 123:183-184 (2001), American Chemical Society, USA.

O'Brien, et al., "Developing an understanding of the processes controlling the chemical bath deposition of ZnS and CdS," *J. Mater. Chem.*, 8(11):2309-2314 (1998), USA.

Reynoso, et al., "CdTe quantum dots in $Er^{3+}$ -doped borosilicate glass," 1879-1881 (1996), Chapman & Hall.

"Surromed, Inc. Awarded SBIR Grant from the NIH to Develop Nanobarcode™ Identification Tag Technologies for Mouse Phenotyping" [online], [retrieved on Aug. 26, 2002]. Retrieved from the Internet <URL: www.noonanrusso.com/news/surromed/01news/surro08.02.html>.

"High Quality—Production Quantities of Semiconductor Nanocrystals for the Nanotechnology Researcher" [online], [retrieved on Sep. 10, 2002]. Retrieved from the Internet <URL: www.evidenttech.com/products/evidots.php>.

Gallardo, et al., "Photochemistry and Radiation Chemistry of Colloidal Semiconductors 34. Properties of Q-PbS,":1080-1090.

Wark, et al., "Influence of the Zeolite Matrix on the Optical Properties and the Stability of Hosted PbS Nano-Particles," *Phys. Chem.*, 101(11):1635-1639 (1997), Wiley-VCH, Germany.

Nenadović, et al., "Transient Bleaching of Small PbS Colloids. Influence of Surface Properties," *J. Phys. Chem.*, 94:6390-6396 (1990), American Chemical Society, USA.

Tamulaitis, et al., "Optical nonlinearities of glass doped with PbS nanocrystals," *Journal of Applied Physics*, 88(1):178-182 (2000), American Institute of Physics, USA.

Henglein, "Nanoclusters of Semiconductors and Metals," *Phys. Chem.*, 101:1562-1572 (1997), Wiley-VCH, Germany.

Sugimoto, et al., "Synthesis of uniform particles of CdS, ZnS, PbS and CuS from concentrated solutions of the metal chelates," *Colloids and Surfaces A: Physicochemical and Engineering Aspects*, 135:207-226 (1998), Elsevier Science B.V., UK.

Wang, et al., "A room temperature chemical route to nanocrystalline PbS semiconductor," *Materials Letters*, 40:255-258 (1999), Elsevier Science B.V., UK.

Wang, et al., "Properties of CdS and PbS Clusters Encapsulated in Zeolites," *J. Phys. Chem.*, 198:257-260 (1987), American Chemical Society, USA.

Trindade, et al., *J. Mater. Chem.*, 6(3):343-347 (1996).

Trindade, et al. "Synthesis of CdS and CdSe Nanocrystallites Using a Novel Single-Molecule Precursors Approach," *Chem. Mater.*, 9:523-530 (1997), American Chemical Society, USA.

Kang, et al., "Electronic structure and optical properties of PbS and PbSe quantum dots," *J. Opt. Soc. Am.* B, 14:(7) 1632-1646 (1997), Optical Society of America, USA.

Ogawa, et al., "Photoelectrochemistry of Films of Quantum Size Lead Sulfide Particles Incorporated in Self-Assembled Monolayers on Gold," *J. Phys. Chem. b*, 101:5707-5711 (1997), American Chemical Society, USA.

Ward, et al., "The Synthesis of Quantum Size Lead Sulfide Particles in Surfactant-Based Complex Fluid Media," *Journal of Colloid and Interface Science*, 161:316-320 (1993), Academic Press, Inc., USA.

Okuno, et al., "Strong confinement of PbSe and PbS quantum dots," *Journal of Luminescence*, 87-89: 491-493 (2000), Elsevier Science B.V., UK.

Borrelli, et al., "Quantum confinement of PbS microcrystals in glass," *Journal of Non-Crystalline Solids*, 180:25-31 (1994), Elsevier Science B.V., UK.

Bawendi, et al., "Electronic Structure and Photoexcited-Carrier Dynamics in Nanometer-Size CdSe Clusters," *Physical Review Letters*, 65(13):1623-1626 (1990).

Guerreiro, et al., "PbS quantum-dot doped glasses as saturable absorbers for mode locking of a Cr:forsterite laser," *Appl. Phys. Lett.*, 71(12):1595-1597 (1997), American Institute of Physics, USA.

Wundke, et al., "PbS quantum-dot-doped glasses for ultrashort-pulse generation," *Applied Physics Letters*, 76(1):10-12 (2000).

Boyle, et al., "Novel approach to the deposition of CdS by chemical bath deposition: the deposition of crystalline thin films of CdS from acidic baths," *Journal of Materials Chemistry*, 9:725-729 (1999).

Alivisatos, "Semiconductor Clusters, Nanocrystals, and Quantum Dots," *Science*, 271:933-937 (1996).

Voss, "Silicon Lasers," *MIT Technology Review*, p. 35 (Jun. 2001).

Johnstone, "A Bright Future for Displays," *MIT Technology Review*, pp. 81-85 (Apr. 2001).

"Quantum Dot Illuminating" [online], [retrieved on May 21, 2001]. Retrieved from the Internet <URL: www.qdots.com/new/corporate/corporate.html>.

Fairley, P., "Nanodot Lasers", *MIT Technology* Review p. 32 (Apr. 2001).

Synthesis of CdS Nanocrystals Using Cadmium Dichloride and Trioctyphosphine Sulfide, Mike Lazell and Paul O'Brien, Journal of Materials Chemistry, 1999, 9, 1381-1382.

Cadmium Sulfide of Small Dimensions Produced in Inverted Micelles, P. Lianos and J.K. Thomas, Chemical Physics Letters, vol. 125, No. 3, Apr. 4, 1986, p. 299-302.

Photochemistry of Colloidal Semiconductors. 20. Surface Modification and Stability of Strong Luminescing CdS Particles, Lubomir Spanhel, Markus Haase, et al, J. Am. Chem. Soc., 1987, 109, p. 5649-5655.

Arrested Solid-Solid Phase Transition in 4-nm-Diameter CdS Nanocrystals, M. Hasse and A.P. Alivisatos, J. Phys. Chem. 1992, 96, 6756-6762.

Luminescence of Colloidal CdS Particles in Acetonitrile and Acetonitrile/Water Mixtures, J. Ramsden, Stephen E. Webber, et al., J. Phys. Chem. 1985, 89, 2740-2743.

Synthesis and Optical Properties of CdSe and CdSe/CdS, Encai Hao, et al., Chem. Mater. 1999, 11, 3096-3102.

Band-edge Absorption and Luminescence of Nonspherical Nanometer-size Crystals, Al. L. Efros, et al., Rapid Communication, Physical Review B, vol. 47, No. 15, Apr. 15, 1993-I, The American Physical Society.

Sulphur Passivation of Gallium Antimonide Surfaces, P.S. Dutta, et al., Appl. Phys. Lett. 65 (13), Sep. 26, 1994, 1994 American Institute of Physics, p. 1695-1697.

Perspectives on the Physical Chemistry of Semiconductor Nanocrystals, A.P. Alivisatos, J. Phys. Chem. 1996, 100, 13226-13239.

Synthesis and Characterization of Nearly Monodisperse CdE (E=S, Se, Te) Semiconductor Nanocrystallites, C.B. Murray, et al., J. Am. Chem. Soc. 1993, 115, 8706-8715.

Excited Electronic States and Optical Spectra of ZnS and CdS Crystallites in the =15 to 50 A Size Range: Evolution from Molecular to Bulk Semiconducting Properties, R. Rossetti, et al., J. Chem. Phys. 82 (1) Jan. 1, 1995, p. 552-559.

Lead Salt Quantum Dots: the Limit of Strong Quantum Confinement, Frank E. Wise, Acc. Chem. Res. 2000, 33, 773-780.

Photoconductivity of CdS Nanocluster-doped Polymers, Chemical Physics Letters, vol. 200, No. 1,2, Nov. 27, 1992, p. 71-75.

CdS Nanoclusters: Synthesis, Characterization, Size Dependent Oscillator Strength, Temperature Shift of Excitonic Transition Energy, and Reversible Absorbance Shift, T. Vossmeyer, et al, J. Phys. Chem. 1994, 98, 7665-7673.

Optical Properties of CdS and PbS Clusters Encapsulated in Zeolites, Y. Wang, et al., J. Phys. Chem. 1987, 91, 257-260.

Transport in Quantum Dots: Observation of Atomlike Properties, Seigo Tarucha, MRS Bulletin/Feb. 1998, p. 49-53.

High-Resolution Spectroscopy of Individual Quantum Dots in Wells, Daniel Gammon, MRS Bulletin/Feb. 1998, p. 44-48.

Growth, Spectroscopy, and Laser Application of Self-Ordered III-V Quantum Dots, D. Bimberg, et al., MRS Bulletin/Feb. 1998, p. 31-34.

Collodial Quantum Dots of III-V Semiconductors, Arthur J. Nozik, et al., MRS Bulletin/Feb. 1998, p. 24-30.

Semiconductor Quantum Dots, Alex Zunger, MRS Bulletin/Feb. 1998, p. 15-17.

Electrical Studies of Semiconductor-Nanocrystal Colloids, A.P. Alivisatos, MRS Bulletin/Feb. 1998, p. 18-23.

Atomic and Molecular Clusters in Membrane Mimetic Chemistry, Janos H. Fendler, Chem. Rev. 1987, 87, 877-899.

PASSIVATED NANOPARTICLES, METHOD OF FABRICATION THEREOF, AND DEVICES INCORPORATING NANOPARTICLES

This application is a Divisional of U.S. Ser. No. 11/124,244, filed May 9, 2005, incorporated herein by reference in its entirety, which is a Divisional of U.S. Ser. No. 10/233,587, filed Sep. 4, 2002, which issued as U.S. Pat. No. 6,906,339, on Jun. 14, 2005, incorporated herein by reference in its entirety, which is an application claiming the benefit under 35 U.S.C. 119(e) of U.S. Application Ser. No. 60/316,979, filed Sep. 5, 2001, incorporated herein by reference in its entirety.

FIELD OF THE INVENTION

The present invention is directed generally to semiconductor materials and more particularly to passivated nanoparticles.

BACKGROUND OF THE INVENTION

Numerous patents and publication have been issued on the fabrication of semiconductor nanoparticles (also called "quantum dots" or "nanocrystals") and their applications in the last few years. These semiconductor nanoparticles are used as a lasing medium in a laser, as fluorescent tags in biological testing methods and as electronic devices.

A relatively new correlative method for easier manipulation and spatial organization of the nanoparticles has been proposed in which the nanoparticles are encapsulated in a shell. The shells which encapsulate the nanoparticles are composed of various organic materials such as Polyvinyl Alcohol (PVA), PMMA, and PPV. Furthermore, semiconductor shells have also been suggested.

For example, U.S. Pat. Nos. 6,225,198 and 5,505,928, incorporated herein by reference, disclose a method of forming nanoparticles using an organic surfactant. The process described in the U.S. Pat. No. 6,225,198 includes providing organic compounds, which are precursors of Group II and Group VI elements, in an organic solvent. A hot organic surfactant mixture is added to the precursor solution. The addition of the hot organic surfactant mixture causes precipitation of the II-VI semiconductor nanoparticles. The surfactants coat the nanoparticles to control the size of the nanoparticles. However, this method is disadvantageous because it involves the use of a high temperature (above 200° C.) process and toxic reactants and surfactants. The resulting nanoparticles are coated with a layer of an organic surfactant and some surfactant is incorporated into the semiconductor nanoparticles. The organic surfactant negatively affects the optical and electrical properties of the nanoparticles.

In another prior art method, II-VI semiconductor nanoparticles were encapsulated in a shell comprising a different II-VI semiconductor material, as described in U.S. Pat. No. 6,207,229, incorporated herein by reference. However, the shell also interferes with the optical and electrical properties of the nanoparticles, decreasing quantum efficiency of the radiation and the production yield of the nanoparticles.

The commercialization of the nanoparticles has also been hampered due to the high cost of production of the nanoparticles. The methods used for synthesis are extremely toxic at high temperatures and hence pose significant safety problems during mass production.

Furthermore, it has been difficult to form nanoparticles of a uniform size. Some researchers claimed to have formed nanoparticles in a solution having a uniform size based on transmission electron microscopy (TEM) measurements and based on approximating nanoparticle size from the position of the exciton peak in the absorption spectra of the nanoparticles. However, the present inventor has determined that both of these methods do not lead to an accurate determination of nanoparticle size in the solution.

TEM allows actual observation of a few nanoparticles precipitated on a substrate from a solution. However, since very few nanoparticles are observed during each test, the nanoparticle size varies greatly between observations of different nanoparticles from the same solution. Therefore, even if a single TEM measurement shows a few nanoparticles of a uniform size, this does not correlate to an entire solution of nanoparticles of a uniform size.

Using the absorption spectra exciton peak position to approximate nanoparticle size is problematic for a different reason. The exciton peak position does not show whether the individual nanoparticles in a solution are agglomerated into a large cluster. Thus, the size of the individual nanoparticles that is estimated from the location of the exciton peak in the absorption spectra does not take into account that the individual nanoparticles have agglomerated into clusters.

For example, Evident Technologies (www.evidenttech.com) markets EviDots® CdSe nanocrystal test kits. The Evident Technologies website indicates that the nanocrystals in these kits are coated with a surfactant and can be stored unopened in toluene solvent for up to two months. This website also implies that the nanoparticles in the test kit solution have a uniform size. It appears that the nanoparticle size was approximated from the exciton peak position of the absorption spectra of these nanoparticles. However, when the present inventor arranged for the size of these EviDots® nanoparticles to be measured by a photon correlated spectroscopy (PCS) method, the results indicated that the nanoparticles in the solution have agglomerated into large clusters and have a non-uniform size distribution. Thus, while the agglomerated nanoparticles have acceptable optical properties, they have unacceptable mechanical properties due to the agglomeration for uses which require a precise size distribution, such as for biological marker use. Furthermore, the EviDots® nanoparticles agglomerate into large, visible clumps and precipitate out of the solution onto the bottom of the vial in less than an hour after the toluene containing vial is unsealed.

BRIEF SUMMARY OF THE INVENTION

A preferred embodiment of the present invention provides a plurality of semiconductor nanoparticles having an elementally passivated surface.

Another preferred embodiment of the present invention provides a plurality of semiconductor nanoparticles having an average size between about 2 nm and about 100 nm with a size standard deviation of less than 60 percent of the average nanoparticle size determined by photon correlated spectroscopy (PCS) method.

Another preferred embodiment of the present invention provides a method of making semiconductor nanoparticles, comprising forming semiconductor nanoparticles of a first size in a solution, and providing an etching liquid into the solution to etch the semiconductor nanoparticles of the first size to a second size smaller than the first size.

Another preferred embodiment of the present invention provides a method of making semiconductor nanoparticles, comprising reacting at least a first reactant and a second reactant in a solution to form the semiconductor nanoparticles in the solution, wherein a first reactant provides a passivating element which binds to dangling bonds on a surface of the nanoparticles to passivate the surface of the nanoparticles.

DETAILED DESCRIPTION OF THE PREFERRED EMBODIMENTS

Figure 1:
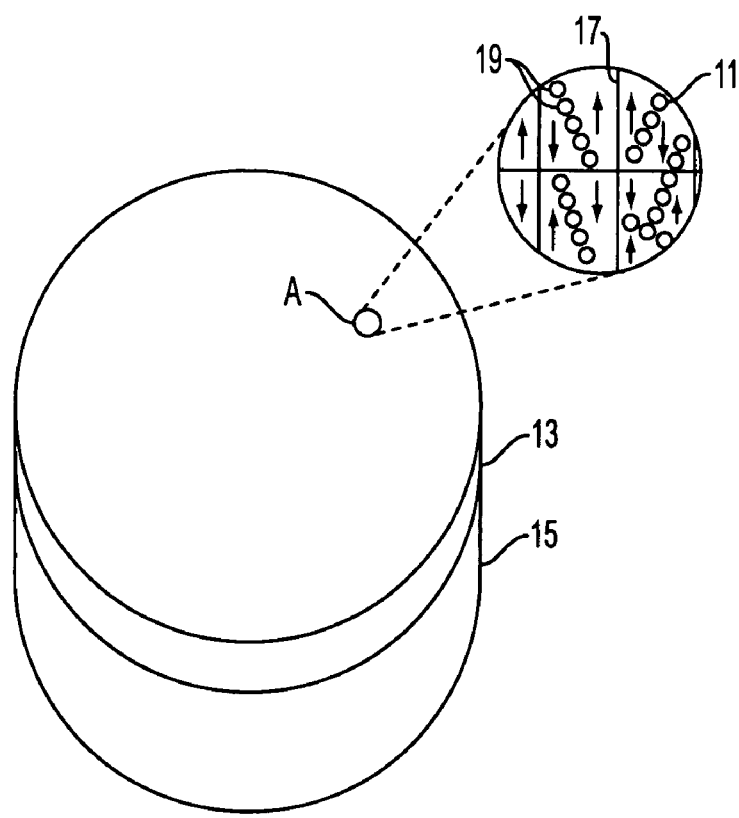
FIG. 1 is a three dimensional view of a magnetic data storage medium according to one preferred embodiment of the present invention.

The present inventor has realized that prior art nanoparticles agglomerate and have a non-uniform size distribution because dangling bonds cause separate nanoparticles to bond together. Therefore, by forming nanoparticles with a passivated surface decreases bonding between nanoparticles and thus decreases nanoparticle agglomeration. A passivated surface comprises surface having passivated dangling bonds, where a passivating element is bound to the dangling bonds. Furthermore, the passivating element reduces or eliminates undesirable reconstructions of atomic positions on the nanoparticle surface which cause energy levels to appear within the band gap of the nanocrystals. These extra energy levels may lead to decreased light emission at desired wavelengths and emission and absorption of light at undesired wavelengths.

It should be noted that a true or "elemental" passivated surface should be distinguished from formation of a semiconductor or organic surfactant shell around a nanoparticle of the prior art. While these prior art nanoparticles with a shell are sometimes referred to as "passivated", the shell usually does not have the capability of passivating dangling bonds on the surface of the nanoparticle because the lattice constant of the shell is different from the lattice constant of the nanoparticles. The lattice mismatch of the shell and nanoparticles would actually create more surface states at the shell/nanoparticle interface, which degrades nanoparticle luminescence efficiency. Thus, such prior art nanoparticles that are encapsulated in a shell are not truly "passivated." Furthermore, nanoparticles coated in a shell are not elementally passivated because an organic or inorganic compound is formed on the nanoparticle, rather than a passivating element which is bound to the dangling bonds.

The elementally passivated nanoparticles can be formed and stored in water, rather than in an organic solvent as are prior art nanoparticles. Furthermore, in contrast to the prior art nanoparticles, the elementally passivated nanoparticles do not significantly agglomerate even when the vial with the water solvent is left unsealed.

The present inventor has also realized that nanoparticles with a uniform size distribution can be formed by first forming large nanoparticles with a random size distribution and then reducing the size of the nanoparticles to the desired size by etching the larger nanoparticles. By selecting an appropriate type and amount of etching medium, the large nanoparticles can be automatically etched down to a uniform smaller size. In contrast, the prior art nanoparticle formation methods attempt to control the size of the nanoparticles by inhibiting growth of nanoparticle nuclei in a solution by using a surfactant or a shell. However, it is difficult to control nanoparticle size distribution by the prior art method because nucleation and growth of nanoparticles is unpredictable and subject to many environmental variables.

The term nanoparticles includes particles having an average size between about 2 and about 100 nm, preferably particles having an average size between about 2 and about 50 nm. Most preferably, the nanoparticles comprise quantum dots having an average size between about 2 and about 10 nm. Preferably, the first standard deviation of the size distribution is 60% or less, preferably 40% or less, most preferably 15 to 30% of the average particle size.

In a quantum dot, an electron is confined to a piece of semiconductor material small enough such that the volume in which the electron resides is on the order of the wave-volume of the electron itself. The electron's formerly continuous spectrum will become discrete, and its energy gap will increase. The size of semiconductor volume necessary to achieve perceived electron confinement should be on the order of the Bohr radius of the bound state of an electron-hole pair (i.e., an exciton).

The nanoparticles may comprise any material that can form nanoparticles, such as a II-VI, IV-VI, or a III-V semiconductor material. Preferably, the nanoparticles comprise IV-VI or II-VI semiconductor nanoparticles, such as CdS, ZnS, PbS, CdSe, ZnSe, PbSe, ZnTe, PbTe and CdTe nanoparticles. Ternary and quaternary semiconductor nanoparticles, such as CdZnS, CdZnSe, CdZnTe, CdZnTeSe and CdZnSSe, for example, may also be used. Furthermore, semiconductor nanoparticles other than IV-VI or II-VI nanoparticles may also be used. These nanoparticles include GaAs, GaP, GaN, InP, InAs, GaAlAs, GaAlP, GaAlN, GaInN, GaAlAsP, GaAlInN, and various other III-V materials.

The passivating element may be any element which can bind to and passivate dangling bonds on the nanoparticle surface. Preferably, the passivating element comprises one or more elements other than carbon (i.e., an inorganic passivating agent). Most preferably, the passivating element is selected from a group consisting of H, S, Se and Te. Sulfur is the most preferred of these passivating elements. Thus, for II-VI and IV-VI semiconductor nanoparticle, by using a non-stoichiometric or excess amount of the Group VI element in the Group VI containing reactant compound, it is possible to locate the Group VI compound, such as S, Se and Te on the surface of the nanoparticle in such a way as to passivate the dangling bonds. For III-V semiconductors, an extra reactant containing S, Se and Te may be added to passivate the nanoparticle surface. Furthermore, hydrogen passivating element may be provided by using a hydrogen containing reactant, such as an ammonia compound, during the formation of the nanoparticles. Thus, a IV-VI or II-VI semiconductor nanoparticle passivated by its Group VI element (i.e., CdS, PbS or ZnS passivated by S, CdTe passivated by Te, etc.) is considered to be self passivated.

For example, for sulfide containing IV-VI or II-VI semiconductor nanoparticles (i.e., CdS, PbS, ZnS and compounds thereof), the passivating element preferably comprises S and/or H. Sulfur is most preferred. For selenide containing IV-VI or II-VI semiconductor nanoparticles (i.e., CdSe, PbSe, ZnSe and compounds thereof), the passivating element preferably comprises Se and/or H. For telluride containing IV-VI or II-VI semiconductor nanoparticles (i.e., CdTe, PbTe, ZnTe and compounds thereof), the passivating element preferably comprises Te and/or H. Alternatively, sulfur is used as the passivating element for the selenide or telluride nanoparticles.

The passivated nanoparticles are capable of being suspended in water without substantial agglomeration and substantial precipitation on container surfaces for at least 30 days, preferably for at least 90 days. This means that at least 70%, preferably 95%, most preferably over 99% of the nanoparticles are suspended in water without agglomerating and precipitating on the bottom and walls of the container. It should be noted that the passivated nanoparticles may also be suspended in liquids other than water without substantial agglomeration and substantial precipitation on container surfaces for at least 30 days, preferably for at least 90 days.

The passivated nanoparticles may be fabricated using an environmentally friendly, non-toxic, low temperature (room temperature or close to room temperature) process. Due to its simple chemistry, the nanoparticles can be fabricated in large quantities from water based solutions. The passivated nanoparticles synthesized by the preferred method of the present invention are comparable or better in terms of crystalline quality than the prior art nanoparticles and are significantly more stable (i.e., in terms of agglomeration and precipitation form a solution) than the prior art nanoparticles.

A preferred method of making passivated semiconductor nanoparticles comprises reacting at least a first reactant and a second reactant in a solution to form the semiconductor nanoparticles in the solution. The first reactant provides a passivating element which binds to dangling bonds on a surface of the nanoparticles to passivate the surface of the nanoparticles.

The semiconductor nanoparticles can be formed by reacting two compounds in a solution using a century old room temperature solution chemistry. Preferably, one of the reactants is an ammonium compound, such as ammonium sulfide. For example, to form PbS nanoparticles, the two preferred reactants can be $(NH_4)_2S_{1+x}$ and PbO. PbO is preferably in solid form and $(NH_4)_2S_{1+x}$ is preferably in liquid form. The "x" in $(NH_4)_2S_{1+x}$ means that an excess (i.e., nonstoichiometric) amount of sulfur is provided in this reactant. When these reactants are mixed together, PbS precipitates out of the solution in solid form and the ammonia evaporates from the liquid according to the following reaction:

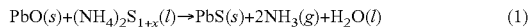  (1)

While this reaction has been known for over one hundred years, the present inventor believes that it has only been used to form bulk PbS powder, and not for nanoparticle fabrication. Thus, there was no recognition in the prior art that the reaction conditions could be controlled to form nanoparticles rather than a bulk PbS powder. It should be noted that the nanoparticles may have a different color than the bulk PbS powder. The nanoparticle color depends on their size, since the band gap of the nanoparticles and thus the absorption cut off wavelength is a function of the nanoparticle size. The nanoparticles have a range of color, such as red, orange, yellow, etc. In contrast, the bulk PbS powder appears black to a human observer since it absorbs all light.

There are several different methods to form nanoparticles rather than bulk powder by controlling the reaction conditions to obtain a desired average particle size. One method of controlling the reaction conditions comprises diluting at least one reactant with water. For example, the $(NH_4)_2S_{1+x}$ reactant may be diluted with water prior to mixing it with PbO. Another method of controlling the reaction conditions comprises controlling the pH of the solution by adding an acid, such as HCl to the solution. A third method of controlling the reaction conditions comprises selecting a solid second reactant powder, such as PbO powder, having a predetermined average particle size. Any two, and preferably all three methods are used in combination to obtain nanoparticles rather than bulk powder.

Preferably, the addition of the acid to the solution etches the nanoparticles to the desired size. Preferably, the acid comprises hydrochloric acid (HCl). Using etchants to etch nanoparticles in solution depends on the reaction chemistry with the other reagents present in the solution. The present inventor has attempted to etch PbS semiconductor nanoparticles with a variety of acids, such as HCl, $HNO_3$, HF, $H_2O_2$, $CH_3COOH$ and combinations of the above. While etching of the PbS sulfide nanoparticles occurred with more than one etchant, the present inventor found that the etching rates for acids other than HCl were not uniform. Moreover, reaction of the etchants other than HCl with the chemical by-products or reagents present in the solution resulted in formation of undesired precipitates, which leads to difficulties in extracting the nanoparticles from the solution and causes undesired absorption of nanoparticles on the precipitates. However, the use of hydrochloric acid, HCl, to etch the IV-VI sulfide nanoparticles, such as PbS, resulted in uniform etch rates and absence of undesired precipitates. It should be noted that the present invention is not limited to the use of HCl, and that other etchants may be used for other nanoparticle compositions.

Therefore, nanoparticles with a large average size and a non-uniform size distribution may be formed in a solution first. Then, the acid, such as HCl, is added to the solution and the solution is agitated, such as by a magnetic stirrer. The acid reduces the size of the nanoparticles to the desired size by etching the nanoparticles. Thus, the etching "tunes" the nanoparticles to a desired size. The general reaction chemistries for the etching step of PbS and CdS nanoparticles are shown below:

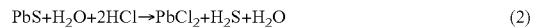  (2)

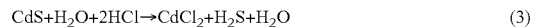  (3)

Figure 6:
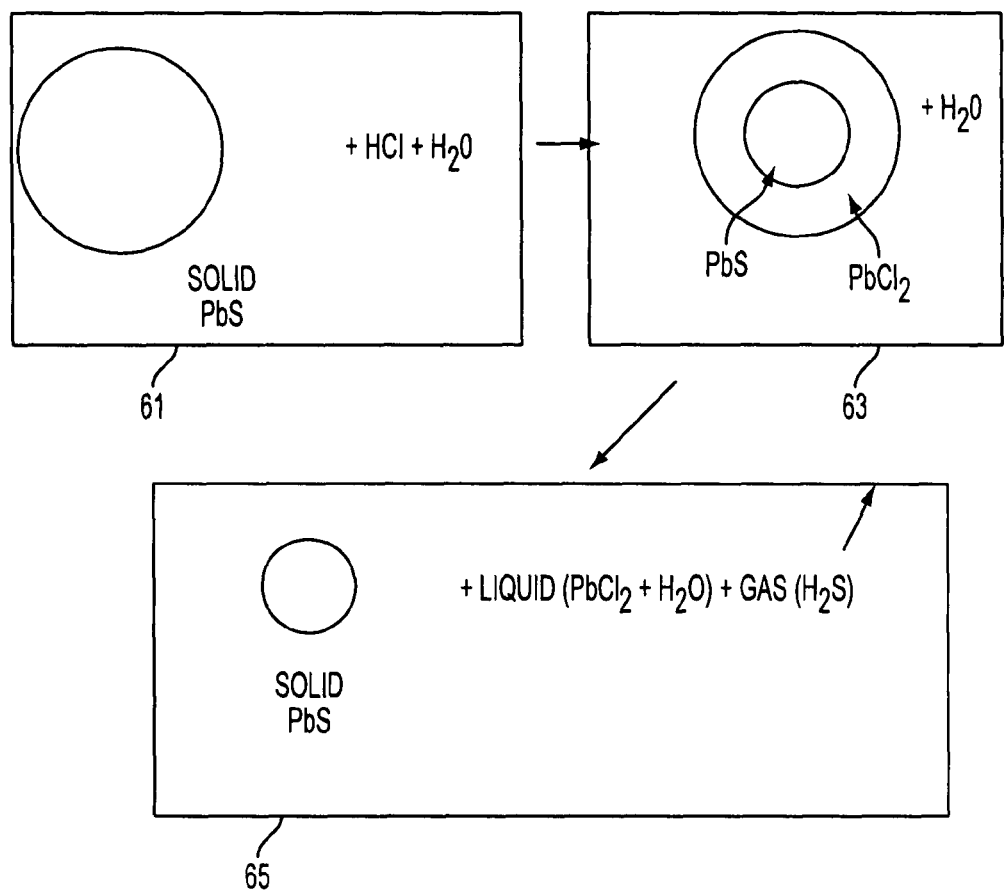
FIG. 6 is a schematic illustration of process steps in a method of making nanoparticles according to the preferred embodiments of the present invention.

A model depicting the size tuning of PbS nanoparticles is shown in FIG. 6. First, PbS nanoparticles with a large size are formed in a water solution. Then HCl is added to the solution (box 61 in FIG. 6). HCl reacts with the PbS nanoparticles and forms $PbCl_2$ and $H_2S$ (box 63 in FIG. 6). The etched PbS nanoparticles with the smaller and uniform size remain in the water. $PbCl_2$ remains dissolved in water while $H_2S$ volatile gas escapes from the solution (box 65 in FIG. 6).

The excess passivating element in the solution, such as sulfur, then repassivates the surface of the etched nanoparticles. By selecting an appropriate type and amount of etching medium, the large nanoparticles can be automatically etched down to a uniform smaller size. If the acid concentration is the solution exceeds the desired amount then the nanoparticles are completely dissolved. The amount of acid is preferably selected based on the amount of the solid Group II reactant added to the solution. Thus, since the amount of Group II reactant, such as PbO or PbCl$_2$, added to the solution is known, the proper amount of acid to be added to the solution can be readily determined.

It should be noted that reactants other than PbO and (NH$_4$)$_2$S$_{1+x}$ may be used to form PbS nanoparticles. Group IIB and IVA metal chloride reactants may also be combined with Group VI sodium reactant in a water solvent to form IV-VI and II-VI nanoparticles and salt.

$$PbCl_2 + Na_2S + H_2O \rightarrow PbS + 2NaCl + H_2O \quad (4)$$

While a Group VI sodium reactant, such as Na$_2$S, is preferred other Group IA-Group VI reactants may be used instead. The water solvent may optionally contain a small amount of a Group VI ammonia compound, such as (NH$_4$)$_2$S$_{1+x}$, which is sufficient to passivate the nanoparticles. Alternatively, the Group VI ammonia compound may be omitted and an excess of the Group VI sodium compound compared to the metal chloride compound may be used instead to provide sufficient sulfur to passivate the nanoparticles. Thus, the excess sulfur for passivation can come from a nonstoichiometric sulfur compound and/or from using a larger molar amount of the sulfur compound than the molar amount of the metal compound. Therefore, a nonstoichiometric sulfur compound is not required to obtain sulfur passivation.

As indicated above, II-VI nanoparticles other than PbS may be fabricated using similar water based reaction chemistry. Thus, zinc or cadmium oxide or chloride may be mixed with ammonium sulfide or sodium sulfide to form ZnS and CdS nanoparticles. For example, the following reactions may be used to form zinc and cadmium sulfide nanoparticles:

$$CdO(s) + (NH_4)_2S_{1+x}(l) \rightarrow CdS(s) + 2NH_3(g) + H_2O(l) \quad (5)$$

$$ZnO(s) + (NH_4)_2S_{1+x}(l) \rightarrow ZnS(s) + 2NH_3(g) + H_2O(l) \quad (6)$$

$$CdCl_2 + Na_2S + H_2O \rightarrow CdS + NaCl + H_2O \quad (7)$$

$$ZnCl_2 + Na_2S + H_2O \rightarrow ZnS + NaCl + H_2O \quad (8)$$

Other reactants, such as metal nitrate, perchlorate, acetate and sulfate compounds and H$_2$S and Na$_2$S$_2$O$_3$ sulfur compounds are less preferred, but may be used if desired. For example, to form CdS nanoparticles, Cd(NO$_3$)$_2$, Cd(ClO$_4$)$_2$, Cd(CH$_3$COO)$_2$, Cd(SO$_4$)$_2$ may be used as a cadmium source. Alternatively, various other organic reactants, such as thiourea, trioctylphosphine sulfide (TOPS), Cd[NH$_2$CSNH]$_2$Cl$_2$ or Cd(CH$_3$)$_3$ are also less preferred, but may be used if desired.

Alternatively, selenide and telluride nanoparticles may be formed instead of sulfide nanoparticles. (NH$_4$)$_2$SeO$_4$ dissolved in water may be used as one reactant and a solid lead, cadmium or zinc compound, such as an oxide compound, may be used as the other reactant to form PbSe, CdSe or ZnSe nanoparticles having a selenide passivated surface. A similar reaction may be carried out for telluride based nanoparticles using (NH$_4$)$_2$TeO$_4$ dissolved in water to form PbTe, CdTe or ZnTe nanoparticles. Selenide and telluride containing nanoparticles may also be formed using a sodium selenide or telluride source, such as Na$_2$Se and Na$_2$Te instead of Na$_2$S in formulas (4), (7) and (8) above.

To form III-V semiconductor nanoparticles having a surface passivated by at least one of sulfur and hydrogen, liquid (NH$_4$)$_2$S$_{1+x}$ reactant is provided in addition to Group III and Group V reactants.

Several exemplary methods of making PbS nanoparticles are described below. These methods should not be considered as being limiting on the scope of the invention. In one example, two grams of PbCl$_2$ powder are dissolved in 100 ml of warm water, preferably 60-70° C. water. The temperature of the water controls the dissolution time of the powder. Water at other temperatures, such as at room temperature can be used instead. Lower water temperature results in longer dissolution times. In parallel and separately, two grams of Na$_2$S powder are dissolved in 100 ml of warm water, preferably 60-70° C. water. The initial size of the formed nanoparticles can be tuned by mixing different quantities of the above two solutions. For example, when 5 ml of PbCl$_2$ solution is added to 10 ml of Na$_2$S solution the nanoparticle sizes are smaller (about 50 nm) than when 15 ml of Na$_2$S solution is used (particle sizes of about 120 nm). Thus, the nanoparticle size decreases as the PbCl$_2$ to Na$_2$S ratio increases. The solution should be richer in sulfur than lead for passivating the nanoparticle surfaces. Post synthesis nanoparticle size tuning is done by adding a dilute solution of HCl:H$_2$O (1:50 by volume percent, where 1 ml of HCl is dissolved in 50 ml of H$_2$O) to the water containing the nanoparticles. This HCl:H$_2$O solution is added to the water containing the nanoparticles in small amounts, such as in 2 ml amounts, to tune the nanoparticle size.

In another example, 10 grams of PbO powder are dissolved in 100 ml of warm (NH$_4$)$_2$S$_{1+x}$ aqueous solution, preferably having a temperature of 30-40° C. The temperature of the solution controls the dissolution time of the powder. The (NH$_4$)$_2$S solution preferably contains of excess sulfur due to non-stoichiometry which assists in passivation of the nanoparticles. The initial size of the nanoparticles can be tuned by mixing different quantities of PbO to the sulfur solution. For example, when 5 grams of PbO are added to 100 ml of sulfur solution, the nanoparticle sizes are smaller (about 70 nm) than when 10 grams of PbO are added to 100 ml of the sulfur solution (about 150 nm). Thus, the nanoparticle size increases as the PbO to sulfur solution ratio increases. Post synthesis nanoparticle size tuning is done by adding a dilute solution of HCl:H$_2$O (1:50 by volume percent, where 1 ml of HCl is dissolved in 50 ml of H$_2$O) to the water containing the nanoparticles. This HCl:H$_2$O solution is added to the water containing the nanoparticles in small amounts, such as in 2 ml amounts, to tune the nanoparticle size.

To narrow the size distribution, one or more purification or particle separation steps are preferably performed before or after the chemical reaction of the reactants. Preferably, the filtering step takes place before the reaction. Preferably, the entire amount of Group II or IV and Group VI reactants are mixed together at the same time to form the nanoparticles, followed by etching the nanoparticles. This provides nanoparticles with a uniform size, such that post etching filtering steps are not required. However, if the Group VI reactant is slowly added to the Group II reactant, then post reaction filtering steps may be needed.

One such particle separation step comprises centrifuging a container containing the solution after reacting the first and the second reactants (i.e., centrifuging the solution containing the formed nanoparticles). Distilled water is added to the sample and the nanoparticles are agitated back into solution in an ultrasonic vibrator. The process of centrifuging and washing may be repeated a plurality of times, if desired.

The above solution is then filtered through mesh or filters after the steps of centrifuging and washing. The mesh or filter can be from made from randomly oriented stacks of cellulose, spherical columns of dielectric materials, polymers, nanoporous media (such as alumina or graphite).

An alternative method to make nanoparticles with a specific size is to decant the solution by storing it for several hours. A first set of heavy or large nanoparticles or nanoclusters settle at the bottom of the container. The second set of smaller nanoparticles still located in a top portion of the solution is separated from the first set of nanoparticles and is removed to a new container from the top of the solution. This process can be repeated several times to separate nanoparticles with different size. During each successive step, the original reagent solution is diluted with a liquid medium which does not dissolve the nanoparticles, such a water. The decanting step may be used instead of or in addition to the centrifuging and filtering steps.

To obtain ultra-pure nanoparticles suitable for various applications, it is desirable to reduce or even eliminate the by-products from the chemical reaction formed during the nanoparticle reaction. The by-products can be reduced or eliminated by choosing a solvent that dissolves the by-products, but not the nanoparticles. For example, ammonia dissolves in water, but PbS does not. Hence ultra-high purity water can be used as a solvent for repeated dissolution of the by-products. Thus, the by-products are reduced or eliminated during the centrifuging and washing steps since the ammonia is dissolved in water. A solvent other than water may be used, depending on the reaction and the by-products that must be dissolved.

The chemical reaction may be carried out at low temperature, such as below 100° C., preferably below 70° C., such as between room temperature (about 25° C.) and 50° C. Furthermore, non-toxic, inorganic reactants are used, such as PbO, $PbCl_2$, $Na_2S$ and ammonium sulfide. Since the reaction is carried out in water from inorganic reactants, the process is inexpensive. The process does not require the use of a surfactant (although one may be used if desired) and a shell is not required to be formed around the nanoparticles as in the prior art. Furthermore, since the core/shell approach is not necessary, a large volume of the nanoparticles may be produced from the reactants with a high yield. Since the passivated nanoparticles are stable in solution, such as water, for several months, they can be easily transported from the manufacturing location to the location where the nanoparticles are placed into an article of manufacture. Furthermore, the passivated nanoparticles may be stored in water or other fluid for one month or more before they are placed into an article of manufacture.

After fabrication, storage and/or transportation, the nanoparticles are suspended in fluid, such as a solution, suspension or mixture. Suitable solutions can be water as well as organic solvents such as acetone, methanol, toluene, alcohol and polyvinyl alcohol. Alternatively, the nanoparticles are located or deposited on a solid substrate or in a solid matrix. Suitable solid matrices can be glass, ceramic, cloth, leather, plastic, rubber, semiconductor or metal. The fluid or solid comprises an article of manufacture which is suitable for a certain use.

The following preferred embodiments provide preferred articles of manufacture which incorporate the nanoparticles. It should be noted that while these articles of manufacture preferably contain the semiconductor nanoparticles where a passivating element passivates dangling bonds on the nanoparticle surface, as described above, they may also contain semiconductor nanoparticles which are made by any other method, including by the prior art methods. In the first four preferred embodiments, the nanoparticles are provided into a fluid.

In a first preferred embodiment, the semiconductor nanoparticles are placed into a polishing slurry. The nanoparticles are dispersed in the polishing slurry fluid. Since the nanoparticles have a very high surface hardness due to their small size, the nanoparticles function as an abrasive medium in the slurry fluid. If desired, another abrasive medium in addition to the nanoparticles may be added to the slurry. The polishing slurry may be used to polish any industrial articles, such as metal or ceramics. Preferably, the slurry is adapted to be used in a chemical-mechanical polishing apparatus used to polish semiconductor wafers and devices. In this case, in addition to the nanoparticles, the slurry also contains a chemical which chemically removes a portion of the semiconductor wafers and devices.

In a second preferred embodiment, the semiconductor nanoparticles are placed into a paint. The nanoparticles are dispersed in the liquid base of the paint. Since the nanoparticles have a uniform size distribution, they provide a substantially uniform color to the paint. In a preferred aspect of the second embodiment, the liquid paint base is selected such that it evaporates after being coated on a surface, such as a wall, ceiling or floor. After the liquid base evaporates, a layer of semiconductor nanoparticles is left on the surface such that the nanoparticles provide a color to the surface. The nanoparticles are very strongly adhered to the surface due to their small size. The nanoparticles are almost impossible to remove by physical means, such as brushes, paint knives or scrubbers, since the nanoparticle size is smaller than the grooves present in the surfaces of the brushes, paint knives or scrubbers. Thus, a chemical method, such as acid etching, is required to remove the nanoparticles from a surface. Therefore, the nanoparticle containing paint is especially adapted to function as a protective paint, such as a rust inhibiting primer paint (which is provided under a conventional paint layer) or a top coat paint (which is provided over a layer of conventional paint). Thus, the nanoparticle containing paint is especially adapted to coat outdoor structures, such as bridges, fences and buildings, since it adheres much better to surfaces than the conventional paints, primers and top coats.

In a third preferred embodiment, the semiconductor nanoparticles are placed into an ink. The nanoparticles are dispersed in a liquid ink. As described above, the nanoparticles can provide a substantially uniform color to a liquid. Thus, by placing the nanoparticles into a ink, once the ink dries and the liquid base evaporates, an image is formed from a layer of nanoparticles. This image will have a very high adhesion to the surface on which it is printed. The ink may comprise computer printer (i.e., ink jet printer, etc.) ink, printing press ink, pen ink or tattoo ink.

In a fourth preferred embodiment, the semiconductor nanoparticles are placed into cleaning composition. The nanoparticles are dispersed in the cleaning fluid. Since the nanoparticles have a high surface hardness, they add a significant scrubbing power to the cleaning fluid. The cleaning fluid may comprise any industrial cleaning fluid, such as a surface cleaning/scrubbing fluid or a pipe cleaning fluid.

In the first four preferred embodiments, the nanoparticles are provided into a fluid. In the following preferred embodiments, the nanoparticles are provided onto a surface of a solid material.

In the fifth preferred embodiment, the nanoparticles comprise a hardness or wear resistant coating located on at least a portion of a device. The device may be any device in which a hardness or wear resistant coating is desired. For example, the device may be a tool (such as a screwdriver or saw blade), a drill bit, a turbine blade, a gear or a cutting apparatus. Since the nanoparticles have a high surface hardness and a very strong adhesion to a substrate, a layer of semiconductor nanoparticles provides an ideal hardness or wear resistant coating for a device. The coating may be formed by providing a fluid containing the nanoparticles and then evaporating or otherwise removing the fluid to leave a layer of nanoparticles on the device surface.

In the sixth preferred embodiment, the nanoparticles comprise a moisture barrier layer located on at least one surface of an article of manufacture. The moisture barrier layer has few or no pores for water or moisture to seep through the layer because the layer comprises a plurality of small size nanoparticles contacting each other. The size of the individual nanoparticles is much smaller than the size of a drop of moisture. Thus, a continuous layer of nanoparticles will resist penetration of moisture. The article of manufacture containing the nanoparticles may be apparel (i.e., coats, pants, etc. made of cloth or leather) or footwear (made of leather, cloth, rubber or artificial leather). Alternatively, the article of manufacture could comprise an edifice, such as a bridge, building, tent, sculpture, etc. For example, since the nanoparticle layer has a higher adhesion to a structure than conventional moisture barrier paint, using the nanoparticle moisture barrier would reduce or eliminate the requirement that the moisture barrier be the reapplied every few years (as is currently done with bridges). The moisture barrier layer may be deposited by providing a fluid containing the nanoparticles and then evaporating or otherwise removing the fluid to leave a layer of nanoparticles on the article surface. Preferably, the layer is formed on an outer surface of the article. If desired, the nanoparticle material could be selected which absorbs sunlight and generates heat when exposed to sunlight (i.e., CdTe nanoparticles). Alternatively, the material may be selected which traps heat emitted by a human body.

In a seventh preferred embodiment, the nanoparticles are provided in a composite ultra low porosity material. Preferably, such a material has a porosity below 10 volume percent, most preferably below 5 volume percent. The composite material comprises a solid matrix material and the nanoparticles incorporated into the matrix. The composite material may be formed by mixing a matrix material powder and nanoparticle powder together and then compressing the mixed powder to form a composite material. Since the nanoparticles have a small size, they occupy the pores in the matrix material to form an ultra low porosity composite material. The matrix material may comprise ceramic, glass, metal, plastic or semiconductor materials. The ultra low porosity material may be used as a sealant, such as a tire sealant. Alternatively, the composite material may be used as a filler in industrial and medical applications.

In an eighth preferred embodiment, the nanoparticles are provided in a filter. A nanoparticle powder may be compressed to form the filter. Alternatively, the nanoparticles may be added to a solid matrix material to form the filter. Since the nanoparticles have a small size, compressed nanoparticles or nanoparticles in a matrix have a low porosity. Thus, the nanoparticle filter has a very fine "mesh" and is able to filter very small particles. The porosity of the filter is greater than the porosity of the ultra low porosity material of the previous embodiment. Preferably, the filter is used to filter a liquid containing very small solid particles. The liquid containing the particles is poured through the filter, which traps particles above a predetermined size.

In a ninth preferred embodiment, the nanoparticles are provided in a composite high strength structural material. Since the nanoparticles have a high surface hardness and low porosity, the nanoparticles may be incorporated into a composite structural material having a solid matrix and nanoparticles dispersed in the matrix. The matrix material may comprise ceramic, glass, metal or plastic. The structural material may be used in buildings as supporting columns and walls and in bridges as the roadway and as supporting columns. The structural material may also be used to form parts of machinery and vehicles, such as cars and trucks.

In a tenth preferred embodiment, the nanoparticles are provided in an environmental sensor. The environmental sensor includes a radiation source, such as a lamp or laser, and a matrix material containing the nanoparticles. The matrix material may comprise liquid, gas or solid material. The sensor is exposed to an outside medium which affects the light emitting properties of the nanoparticles. For example, the sensor may comprise a pollution sensor which is exposed to atmosphere. The amount of pollution in the atmosphere affects the microenvironment of the nanoparticles, which in turn affects their radiation emission characteristics. The nanoparticles are irradiated with radiation, such as visible light or UV or IR radiation, from the radiation source. The radiation emitted and/or absorbed by the nanoparticles is detected by a detector. A computer then determines the amount of pollution present in the atmosphere based on the detected radiation using a standard algorithm. The sensor may also be used to sense gas components and compositions other than the amount of pollution in the atmosphere.

The semiconductor nanoparticles may also be used in lighting applications. The eleventh through the thirteenth embodiments describe the use of the semiconductor nanoparticles in lighting applications.

In the eleventh preferred embodiment, passivated nanoparticles are used as a light emitting medium in a solid state light emitting device, such as a laser or a light emitting diode. In these applications, a current or voltage is provided to the passivated nanoparticles from a current or voltage source. The current or voltage causes the passivated nanoparticles to emit light, UV or IR radiation, depending on the nanoparticle material and size.

In the twelfth preferred embodiment, semiconductor nanoparticles are used to provide support for organic light emitting material in an organic light emitting diode. An organic light emitting diode contains an organic light emitting material between two electrodes. The organic light emitting material emits light when current or voltage is applied between the electrodes. The light emitting organic material may be a polymer material or small dye molecules. Both of these organic materials have poor structural characteristics and impact resistance, which lowers the robustness of the organic light emitting diodes. However, these organic light emitting materials may be incorporated in a matrix of nanoparticles which provides the desired structural characteristics and impact resistance. Since the nanoparticles have the same or smaller size than the dye or polymer molecules, the nanoparticles do not interfere with the light emitting characteristics of the diode.

In the thirteenth preferred embodiment, semiconductor nanoparticles are used in a fluorescent lamp in place of a phosphor. In a conventional fluorescent lamp, a phosphor is coated on an inner surface of a shell of the lamp. The phosphor absorbs UV radiation emitted by a radiation source, such as mercury gas located in the lamp shell, and emits visible light. Since the semiconductor nanoparticles have the ability to absorb UV radiation emitted by the radiation source and to emit visible light, these nanoparticles may be located on at least one surface of the lamp shell. Preferably, the layer of nanoparticles coated on the lamp shell contains nanoparticles which emit different color light, such that the combined light output of the nanoparticles appears as white light to a human observer. For example, the different color light emission may be obtained by mixing nanoparticles having a different size and/or nanoparticles of different semiconductor materials.

The semiconductor nanoparticles may also be used in magnetic data storage applications. The fourteenth and fifteenth preferred embodiments describe the use of the semiconductor nanoparticles in magnetic data storage applications.

In the fourteenth preferred embodiment, the semiconductor nanoparticles are used in a magnetic data storage device. This device includes a magnetic field source, such as a magnet, a data storage medium comprising the nanoparticles, a photodetector. A light source is used to illuminate the nanoparticles. The magnetic field source selectively applies a localized magnetic field source to a portion of the data storage medium. The application of the magnetic field causes the nanoparticles exposed to the field to change their light or radiation emission characteristics or to quench emission of light or radiation all together. The photodetector detects radiation emitted from the nanoparticles in response to the application of a magnetic field by the magnetic field source.

In the fifteenth preferred embodiment, the semiconductor nanoparticles are used in a magnetic storage medium containing a magnetic material. The magnetic material may be any magnetic material which can store data by the alignment of the directions of the spins in the material. Such magnetic materials include, for example, cobalt alloys, such as CoPt, CoCr, CoPtCr, CoPtCrB, CoCrTa and iron alloys, such as FePt and FePd. In one preferred aspect of the fifteenth embodiment, the nanoparticles 11 are randomly mixed throughout a layer of magnetic material 13 formed on a substrate 15, as shown in FIG. 1. The substrate 15 may be glass, quartz, plastic, semiconductor or ceramic. The randomly dispersed nanoparticles are located within the magnetic domains in the magnetic material. The domains are separated by the domain walls. A few domain walls are shown by lines 17 in the close up of area "A" in FIG. 1. The dispersed nanoparticles form barrier layers 19 within the domains. The barrier layers form domain walls in the magnetic material. Therefore, the addition of the nanoparticles has the effect of subdividing the domains in the magnetic material into a plurality of "subdomains" each of which is capable of storing one bit of data (shown as spin arrows in FIG. 1). Thus, the addition of the nanoparticles increases the data storage density of the magnetic material by decreasing the domain size in the magnetic material.

In a second preferred aspect of the fifteenth embodiment, the magnetic storage medium comprises a substrate containing the semiconductor nanoparticles doped with atoms of the magnetic material. Each nanoparticle is adapted to store one bit of data. Thus, small nanoparticles of magnetic material are encapsulated in the semiconductor nanoparticles. In this case, the size of one bit of data storage is only as big as the semiconductor nanoparticle. The magnetic nanoparticles may be doped into the semiconductor nanoparticles using any known doping techniques, such as solid, liquid or gas phase diffusion, ion implantation or co-deposition of the semiconductor and magnetic nanoparticles. Alternatively, the magnetic nanoparticles may be encapsulated within the semiconductor nanoparticles by a plasma arc discharge treatment of semiconductor nanoparticles in contact with magnetic nanoparticles. Similar methods have been previously disclosed for encapsulating magnetic particles in carbon and buckytube shells (see U.S. Pat. Nos. 5,549,973, 5,456,986 and 5,547,748, incorporated herein by reference).

Figure 2:
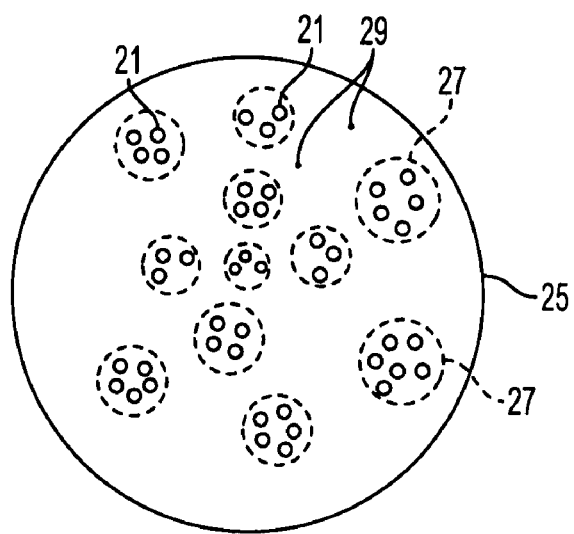
FIG. 2 is a top view of optical data storage medium according to another preferred embodiment of the present invention.

In the sixteenth preferred embodiment, the nanoparticles are used in an optical data storage medium, as shown in FIG. 2. Clusters of nanoparticles 21 are arranged in predetermined patterns on a substrate 25, such that first areas 27 of the substrate 25 contain the nanoparticles 21 while the second areas 29 of the substrate 25 do not contain the nanoparticles 21. The nanoparticles 21 in a solution may be selectively dispensed from an ink jet printer or other microdispenser to areas 27 on the substrate. After the solvent evaporates, a cluster of nanoparticles remains in areas 27. The substrate 25 may be a glass, quartz, plastic, semiconductor or ceramic substrate. Preferably, the substrate 25 is shaped as a disk, similar to a CD. The data from the storage medium is read similar to a CD, by scanning the medium with a laser or other radiation source. The nanoparticles 21 reflect and/or emit light or radiation differently than the exposed substrate areas 29. Therefore, when the substrate is scanned by a laser, a different amount and/or wavelength of radiation is detected from areas 27 than areas 29 by a photodetector. Thus, areas 27 correspond to a "1" data value, while areas 29 correspond to a "0" data value, or vise-versa (i.e., each cluster of nanoparticles 21 is a bit of data). Therefore, the nanoparticles 21 function similar to bumps in a conventional CD or as a material of a first phase in a phase change optical disk. The areas 27 may be arranged in tracks or sectors similar to a CD for ease of data read out.

Figure 3:
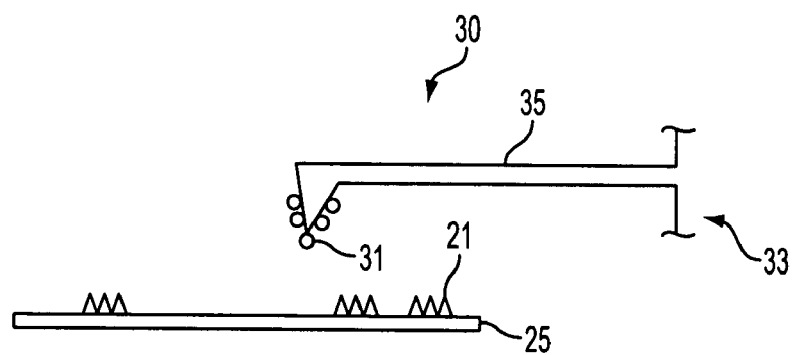
FIG. 3 is a side cross sectional view of an optical cantilever device to another preferred embodiment of the present invention.

The optical data storage medium described above may be used in combination with an optical system of the seventeenth preferred embodiment. The optical system 30 includes at least one microcantilever 35 and light emitting nanoparticles 31 located on a tip of the at least one microcantilever, as shown in FIG. 3. The microcantilever 35 may be an atomic force microscope (AFM) microcantilever or a similar microcantilever that is not part of an AFM. For example, the microcantilever 35 may be conductive or contain conductive leads or wires which provide current or voltage to the nanoparticles to cause them to emit light or radiation. The base 33 of the microcantilever is connected to a voltage or current source. The microcantilever 35 may be scanned over the substrate 25 containing the semiconductor nanoparticles 21 of the previous embodiment. The light emitting nanoparticles 31 on the cantilever irradiate the substrate 25, and the emitted and/or reflected light is detected by a photodetector and analyzed by a computer to read out the data. Of course, the optical system 30 may be used to read data from a conventional CD or phase change optical disk rather than from the medium of the previous embodiment. Furthermore, one or more microcantilevers 35 may be incorporated into an AFM to study surfaces of materials. In this case, the AFM may be used to study the interaction of light or radiation emitted by the nanoparticles 31 and the surface being studied.

In the eighteenth through the twenty first preferred embodiments, the semiconductor nanoparticles are used in an optoelectronic component.

In the eighteenth preferred embodiment, the light emitting nanoparticles are used in an optical switch. In the switch, the light emitting nanoparticles are arranged on a substrate and are connected to a voltage or current source which provides the voltage or current for the light (or radiation) emission. A source of magnetic field, such as a magnet, is provided adjacent to the nanoparticles. When the magnet is turned on, it extinguishes radiation emitted by the nanoparticles.

Figure 4:
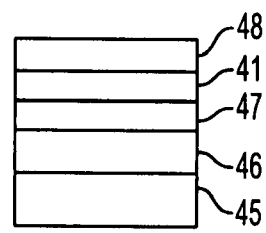
FIG. 4 is a side cross sectional view of an electroluminescent device according to another preferred embodiment of the present invention.

In the nineteenth preferred embodiment, the passivated semiconductor nanoparticles are used in an electroluminescent device, such as the electroluminescent device illustrated in U.S. Pat. No. 5,537,000, incorporated herein by reference. The electroluminescent device 40 includes a substrate 45, a hole injection layer 46, a hole transport layer 47, an electron transport layer 41 and an electron injection layer 48, as illustrated in FIG. 4. An voltage is applied between layers 46 and 48. The voltage generates holes in layer 46 and electrons in layer 48. The holes and electrons travel through layers 47 and 41 and recombine to emit light. Depending on the applied voltage, the recombination occurs either in layer 41 to emit red light or in layer 47 to emit green light. The electron transport layer 41 comprises a layer of passivated semiconductor nanoparticles, such as II-VI nanoparticles. The hole injection layer 46 comprises a conductive electrode, such as indium tin oxide. The hole transport layer 47 comprises an organic polymer material, such as poly-p(paraphenelyne). The electron injection layer 48 is a metal or heavily doped semiconductor electrode, such as a Mg, Ca, Sr or Ba electrode.

Figure 5:
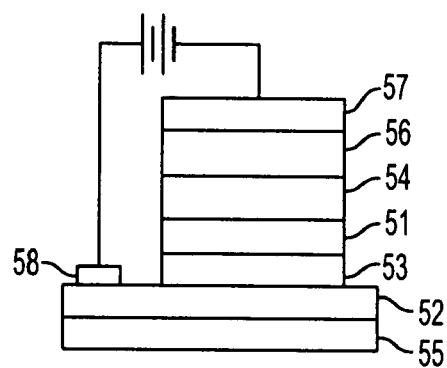
FIG. 5 is a side cross sectional view of a photodetector according to another preferred embodiment of the present invention.

In a twentieth preferred embodiment of the present invention, the semiconductor nanoparticles are used in a photodetector 50, such as a photodetector described in U.S. Pat. No. 6,239,449, incorporated herein by reference. As shown in FIG. 5, the photodetector is formed on a substrate 55. A first heavily doped contact layer 52 is formed on the substrate. A first barrier layer 53 is formed on the contact layer 52. One or more nanoparticle layers 51 are formed on the barrier layer 53. A second barrier layer 54 is formed on the nanoparticle layer(s) 51. A second heavily doped contact layer 56 is formed on the second barrier layer 54. Electrodes 57 and 58 are formed in contact with the contact layers 52, 56. The barrier layers 53, 54 are doped to provide charge carriers and for conductivity. The barrier layers 53, 54 have a higher band gap than the nanoparticles 51. Incident light or radiation excites charge carriers (i.e., electrons or holes) in the nanoparticles to an energy higher than the energy of the bandgap of the barrier layers 53, 54. This causes a current to flow through the photodetector 50 from the emitter electrode to a collector electrode in response to the incident light or radiation with the help of an external voltage applied between the electrodes.

In a twenty first preferred embodiment, the nanoparticles are used in a transmission grating. The nanoparticles are arranged on a transparent substrate in a form of a grating. Since the nanoparticles have a very small size, the grating may be formed with a period smaller than the wavelength of light or radiation that will be transmitted through the grating. Such gratings may be used in waveplates, polarizers or phase modulators. The gratings may be formed by patterning the nanoparticles on the substrate using submicron optical, x-ray or electron beam lithography or by placing individual nanoparticles on the substrate using an AFM or a scanning tunneling electron microscope.

In a twenty second preferred embodiment, the semiconductor nanoparticles are used in an optical filter. The optical filter may comprise a glass, plastic or ceramic transparent matrix with interdispered nanoparticles. Since the nanoparticles absorb a radiation having a wavelength greater than a cutoff wavelength based on the material and size of the nanoparticles, the filter may be tailored to filter a particular range of light or UV radiation wavelengths depending on the material and size of the nanoparticles. Furthermore, the nanoparticles may be used to provide a color to a particular solid material, such as stained or colored glass.

In the twenty third preferred embodiment, the passivated nanoparticles are used in electronic devices, such as transistors, resistors, diodes, and other nanodevices. For example, the nanoparticles may be used in a single electron transistor, as described in U.S. Pat. No. 6,057,556, incorporated herein by reference. The nanoparticles are located on a substrate between a source and a drain electrode. The nanoparticles comprise a channel of the single electron transistor. A plurality of nanoscale gate electrodes are provided over or adjacent to the nanoparticles. This device functions on the principle of controlled correlated single electron tunneling between the source and drain electrodes through the potential barriers between the nanoparticles. A single electron gate circuit can be constructed using this device, where logical "1" and "0" are identified by the presence or absence of an electron.

An example of a nanodevice array is a chip architecture termed cellular automata. With this architecture, the processor portion of the IC is made up of multiple cells. Each of the cells contains a relatively small number of devices, which communicate only with their nearest-neighbor cells. This architectural approach eliminates the need for long intercellular connections, which ultimately put a ceiling on the fastest processing capabilities of an electronic chip. Each cell would consist of approximately five passivated semiconductor nanoparticles or quantum dots.

In the twenty fourth preferred embodiment, the nanoparticles are used as a code or a tag. For example, the nanoparticles may be fashioned into a miniature bar code by AFM, STM or lithography. This bar code may be formed on small items, such as integrated circuits, and may be read by a miniature bar code reader. Of course the code may have symbols other than bars. In another example, the nanoparticles may be used as a tag (i.e., where the nanoparticles are not formed into a particular shape). Since a small amount of the nanoparticles is invisible to the human eye, the nanoparticle code or tag may be added to an item which must be authenticated, such as currency, a credit card, an identification card or a valuable object. To authenticate the item, the presence of the nanoparticles on or in the item is detected by a microscope or by an optical detector. Furthermore, nanoparticles of a certain size which emit a particular wavelength of light may be used to distinguish different objects. Combinations of different nanoparticle sizes which emit a combination of different wavelengths may be used to emit an optical code for more precise identification of the item.

In the twenty fifth preferred embodiment, the passivated nanoparticles are used as sensor probes. For example, a sensor probe may be formed by bonding nanoparticles to affinity molecules using linking agents, as described in U.S. Pat. Nos. 6,207,392, 6,114,038 and 5,990,479, incorporated herein by reference. The affinity molecules are capable of selectively bonding with a predetermined biological or other substance. In response to an application of energy, the nanoparticles emit light or radiation which is detected by a detector. Thus, the presence, location and/or properties of the predetermined substance bound to the affinity molecule may be determined. The linking agents may be polymerizable materials, such as N-(3-aminopropyl)3-mercapto-benzamide. The affinity molecules, such as antibodies, are capable of selectively binding to the predetermined biological substance being detected, such as a particular antigen, etc.

The specific examples of PbS nanoparticles made according to the methods of the preferred embodiments of the present invention and comparative examples using prior art CdSe EvidDots® nanoparticles will now be described. These specific examples are provided for illustration only and should not be considered limiting on the scope of the invention.

Example 1

PbS nanoparticles according to the preferred embodiments of the present invention were prepared by the following method. 2 grams of $PbCl_2$ powder were dissolved in 100 ml of warm water at 60-70° C. 2 grams of $Na_2S$ powder were separately dissolved in 100 ml of warm water (60-70° C.). Both solutions were filtered using 20 nm pore filter paper. 5 ml of the above $PbCl_2$ solution was added to 15 ml of above $Na_2S$ solution and mixed in an ultrasonic vibrator.

The nanoparticle containing solution was analyzed by photon correlated spectroscopy (PCS) using the N4 Plus Submicron Particle Analyzer made by Beckman Coulter, Inc. PCS is a dynamic light scattering (DLS) optical characterization technique which determines particle size based on Brownian motion of particles in a solution. In PCS, measurements of particle size are based on characterization of the time scale of fluctuations of the intensity of laser light scattered from the nanoparticle containing solution. The fluctuations result from an interference pattern modulated by the Brownian motion of the nanoparticles in the solution. The fluctuating laser light signal is transformed into an electrical signal by a photomultiplier. Other similar dynamic light scattering spectroscopy systems which measure the size of particles in the solution are produced by other companies. For example, one such system is the High Performance Particle Size with Non-Invasive Back Scatter (NIBS™) optics characterization system produced by Malvern Instruments.

Figure 7:
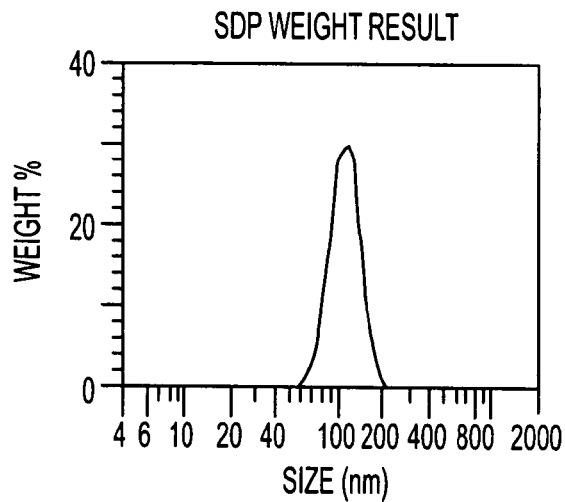
FIGS. 7-11 are PCS spectra from samples made by the method according to the preferred embodiments of the present invention.

The PCS spectra of the solution containing the nanoparticles is shown in FIG. 7. The nanoparticles had a 114.2 nm average size with a standard deviation of 27.8 nm.

Example 2

Figure 8:
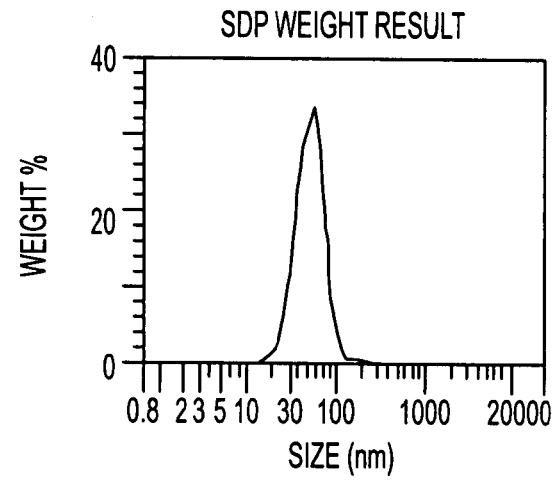

In this example, the nanoparticles of example 1 were etched with diluted HCl. 1 ml of HCl was dissolved in 50 ml of $H_2O$. 2 ml of the above solution was added to the nanoparticle containing solution of example 1. The PCS spectra of the solution containing the etched nanoparticles is shown in FIG. 8. The nanoparticles had a 53.3 nm average size with a standard deviation of 20.8 nm. Thus, adding HCl to the solution reduced the nanoparticle size without completely dissolving the nanoparticles.

Example 3

Figure 9:
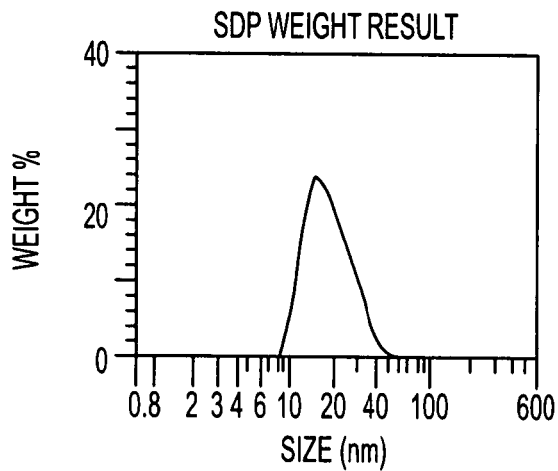

In this example, the nanoparticles of example 2 were etched with additional diluted HCl. 1 ml of HCl was dissolved in 50 ml of $H_2O$. 2 ml of the above solution was added to the nanoparticle containing solution of example 2. The PCS spectra of the solution containing the etched nanoparticles is shown in FIG. 9. The nanoparticles had a 17.6 nm average size with a standard deviation of 9.1 nm.

Example 4

Figure 10:
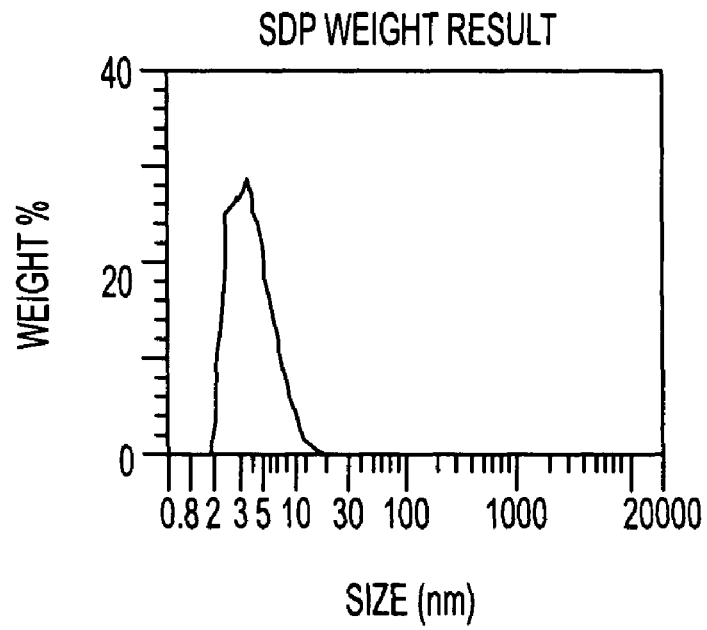

In this example, the nanoparticles of example 3 were etched with additional diluted HCl. 1 ml of HCl was dissolved in 50 ml of $H_2O$. 2 ml of the above solution was added to the nanoparticle containing solution of example 3. The PCS spectra of the solution containing the etched nanoparticles is shown in FIG. 10. The nanoparticles had a 4.5 nm average size with a standard deviation of 2.5 nm.

Example 5

Figure 11:
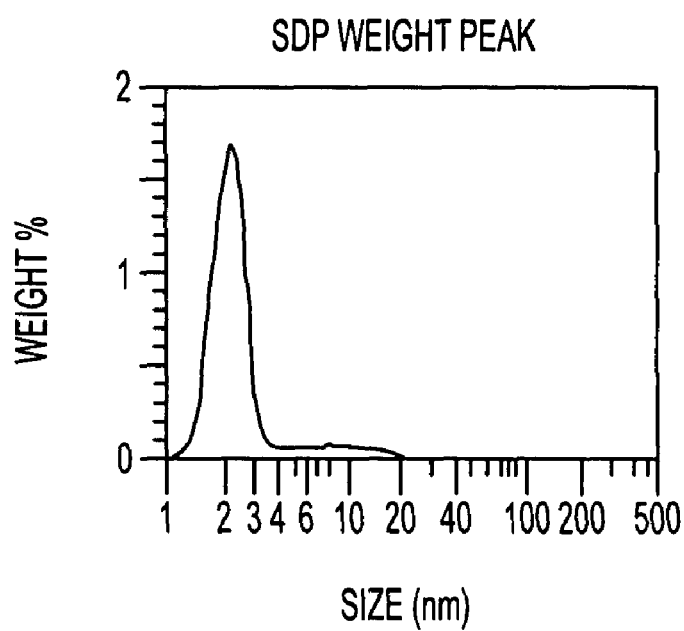

In this example, the nanoparticles of example 4 were etched with additional diluted HCl. 1 ml of HCl was dissolved in 50 ml of $H_2O$. 2 ml of the above solution was added to the nanoparticle containing solution of example 4. The PCS spectra of the solution containing the etched nanoparticles is shown in FIG. 11. The nanoparticles had a 2.0 nm average size with a standard deviation of 0.3 nm (main peak in FIG. 11).

Comparative Example 1

EviDots® CdSe nanocrystals from a test kit supplied by Evident Technologies (www.evidenttech.com) were examined by PCS. The nanocrystals were located in an unopened container containing toluene solvent during PCS testing. The product literature accompanying the test kit indicated that the nanoparticles had an average size of 2.8 nm that was apparently determined from exciton peak position in absorption spectra. The nanoparticle solution had a green color.

Figure 12:
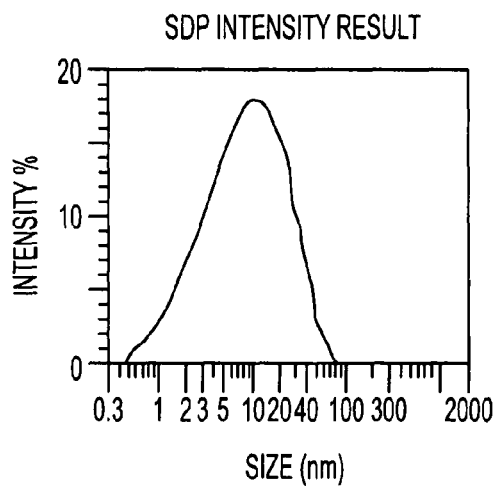
FIGS. 12-15 are PCS spectra from samples made by the prior art method.

The PCS spectra of the solution containing the nanoparticles is shown in FIG. 12. The nanoparticles had a 12.2 nm average size with a standard deviation of 12.6 nm. This is evidence that the 2.8 nm nanoparticles agglomerated in the toluene solution such that the average agglomerated cluster size is 12.6 nm. It is believed that the agglomerated cluster comprises a surfactant with individual 2.8 nanoparticles embedded in the cluster in a roughly honeycomb structure. The individual nanoparticles in the cluster are separated from each other by the surfactant. The solution appears green because each individual nanoparticle in the agglomerated cluster is about 2.8 nm.

Comparative Example 2

EviDots® CdSe nanocrystals from a test kit supplied by Evident Technologies were examined by PCS. The product literature accompanying the test kit indicated that the nanoparticles had an average size of 4 nm that was apparently determined from exciton peak position in absorption spectra. The nanoparticle solution had an orange color.

The PCS spectra of the solution containing the nanoparticles is shown in FIG. 12. The nanoparticles had a 71.2 nm average size with a standard deviation of 76.6 nm. This is evidence that the 4 nm nanoparticles agglomerated in the toluene solution such that the average agglomerated cluster size is 71.6 nm.

Comparative Example 3

EviDots® CdSe nanocrystals from a test kit supplied by Evident Technologies were examined by PCS. The product literature accompanying the test kit indicated that the nanoparticles had an average size of 3.4 nm that was apparently determined from exciton peak position in absorption spectra. The nanoparticle solution had a yellow color.

Figure 13:
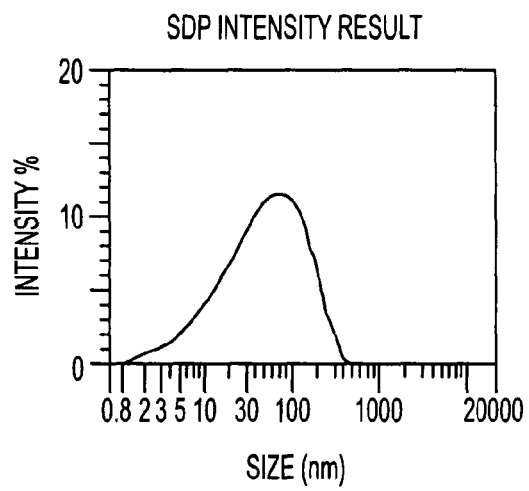

The PCS spectra of the solution containing the nanoparticles is shown in FIG. 13. The nanoparticles had a 79.8 nm average size with a standard deviation of 85.8 nm. This is evidence that the 3.4 nm nanoparticles agglomerated in the toluene solution such that the average agglomerated cluster size is 79.8 nm.

Comparative Example 4

EviDots® CdSe nanocrystals from a test kit supplied by Evident Technologies were examined by PCS. The product literature accompanying the test kit indicated that the nanoparticles had an average size of 4.7 nm that was apparently determined from exciton peak position in absorption spectra. The nanoparticle solution had a red-orange color.

Figure 14:
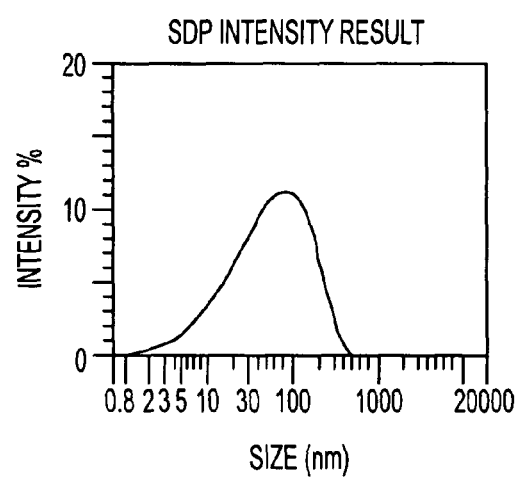
Figure 15:
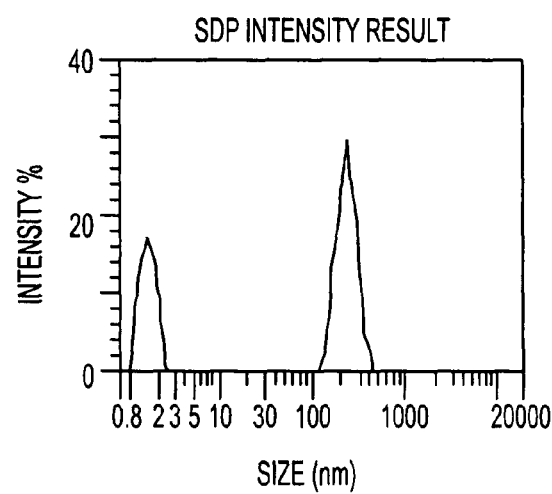

The PCS spectra of the solution containing the nanoparticles is shown in FIG. 14. The nanoparticles had a clear bimodal distribution (two peaks) with a 160.2 nm average size with a standard deviation of 140.6 nm. This is evidence that the 4.7 nm nanoparticles agglomerated in the toluene solution such that the average agglomerated cluster size is 160.2 nm.

Thus, several conclusions can be drawn from the examples and the comparative examples. First, PCS testing shows that nanoparticles in a solution may be agglomerated into a large cluster. Thus, the size of the individual nanoparticles that is estimated from the location of the exciton peak in the absorption spectra does not take into account that the individual nanoparticles have agglomerated into clusters. It appears from the PCS test that the actual average size of nanoparticle cluster may be five to twenty times larger than the size of the individual nanoparticles estimated from the exciton peak location. Second, the method of the preferred embodiments of the present invention allows average nanoparticle size to be controlled more precisely than the prior art method and avoids or reduces the agglomeration of nanoparticles into clusters. Third, the nanoparticles made by the method of the preferred embodiments of the present invention have a much narrower size distribution than the prior art nanoparticles. For example, the nanoparticles made by the method of the preferred embodiments of the present invention have a size standard deviation between about 15 and 56 percent of the average nanoparticle size. In contrast, the prior art nanoparticles have a size standard deviation between about 87 to more than 100 percent of the average nanoparticle size due to agglomeration.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. It is intended that the scope of the invention be defined by the claims appended hereto, and their equivalents.

All of the publications and patent applications and patents cited in this specification are herein incorporated in their entirety by reference.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention, which is defined by the following claims.

What is claimed is:

1. A plurality of semiconductor nanoparticles having an elementally passivated surface, wherein the nanoparticles comprise a IV-VI semiconductor material.

2. The nanoparticles of claim 1, wherein the passivated surface comprises passivated dangling bonds.

3. The nanoparticles of claim 2, wherein the passivated surface comprises an inorganic passivating element bound to the dangling bonds.

4. The nanoparticles of claim 3, wherein:
the passivating element is selected from a group consisting of H, S, Se and Te.

5. The nanoparticles of claim 4, wherein the passivating element is sulfur.

6. The nanoparticles of claim 5 wherein the nanoparticles are PbS or compounds thereof.

7. The nanoparticles of claim 6, wherein the nanoparticles comprise PbS nanoparticles having an average size of 2 to 100 nm.

8. The nanoparticles of claim 4, wherein:
the nanoparticles are PbSe or compounds thereof; and
the passivating element comprises Se.

9. The nanoparticles of claim 3, wherein the nanoparticles are capable of being suspended in water without substantial agglomeration and substantial precipitation on container surfaces for at least 30 days.

10. The nanoparticles of claim 9, wherein the nanoparticles are suspended in water without substantial agglomeration and substantial precipitation on container surfaces.

11. The nanoparticles of claim 1, wherein the nanoparticles have an average size between about 2 nm and about 100 nm with a size standard deviation of less than 60 percent of the average nanoparticle size measured by photon correlated spectroscopy (PCS) method.

12. The nanoparticles of claim 1, wherein:
the nanoparticles are suspended in a solution, suspension or mixture; or
the nanoparticles are located on a solid substrate or in a solid matrix.

13. An article of manufacture comprising the nanoparticles of claim 1, selected from the group consisting of:
(a) polishing slurry comprising a polishing slurry fluid and the nanoparticles of claim 1 in the slurry fluid;
(b) a device containing a hardness or wear resistant coating, wherein the coating comprises the nanoparticles of claim 1, located on at least a portion of the device;
(c) an ultra low porosity material having a porosity below 10 volume percent comprising a solid matrix and the nanoparticles of claim 1 incorporated into the matrix;
(d) a filter comprising compressed nanoparticles of claim 1;
(e) a paint comprising a liquid base and the nanoparticles of claim 1;
(f) an article of clothing or footwear containing a moisture barrier, wherein the moisture barrier comprises a layer of nanoparticles of claim 1, located on at least one surface of the article;
(g) an environmental sensor comprising a radiation source and a matrix material containing the nanoparticles of claim 1;
(h) a light emitting device comprising light emitting nanoparticles of claim 1;
(i) an organic light emitting diode comprising an organic light emitting material in a matrix of nanoparticles of claim 1, a first electrode, and a second electrode;
(j) a lamp, comprising a shell, a source of radiation located in the shell, and a layer of nanoparticles of claim 1 located on at least one surface of the shell, wherein the nanoparticles absorb the radiation emitted by the radiation source and emit visible light;
(k) a magnetic data storage device comprising a magnetic field source, a data storage medium comprising the nanoparticles of claim 1; and a photodetector which detects radiation emitted from the nanoparticles in response to the application of a magnetic field by the magnetic field source;
(l) a magnetic storage medium comprising a magnetic material and the nanoparticles of claim 1;
(m) an optical storage medium comprising a substrate, and the nanoparticles of claim 1 located in predetermined areas of the substrate, such that first areas of the substrate contain the nanoparticles while the second areas of the substrate do not contain the nanoparticles;
(n) an optical system, comprising at least one microcantilever, and light emitting nanoparticles comprising the nanoparticles of claim 1 located on a tip of the at least one microcantilever;
(o) an optical switch, comprising light emitting nanoparticles comprising the nanoparticles of claim 1, and a source of magnetic field which is adapted to extinguish radiation emitted by the nanoparticles when it provides a magnetic field adjacent to the nanoparticles;
(p) an ink comprising a liquid ink and the nanoparticles of claim 1; and
(q) a cleaning composition comprising a cleaning fluid containing the nanoparticles of claim 1.

14. The article of claim 13, wherein:

the device (b) comprises at least one of a tool, a drill bit, a turbine blade, a gear and a cutting apparatus;

the liquid base of the paint (e) evaporates after being applied to a surface, such that the nanoparticles of claim 1 provide a color to a surface;

the moisture barrier of the apparel or footwear (f) generates heat when exposed to sunlight or traps heat emitted by a body;

the layer of nanoparticles in the lamp (j) contains nanoparticles which emit different color light, such that the combined light output of the nanoparticles appears as white light to a human observer; and the nanoparticles in the magnetic storage medium (l) comprise barrier layers located in the magnetic material such that the barrier layers form domain walls in the magnetic material or the medium (l) further comprises a substrate containing the nanoparticles doped with atoms of the magnetic material, such that each nanoparticle is adapted to store one bit of data.

15. The nanoparticles of claim 1, wherein the group VI element of the IV-VI semiconductor material is Pb.

* * * * *